United States Patent [19]

Ferrand et al.

[11] Patent Number: 4,666,681

[45] Date of Patent: May 19, 1987

[54] APPARATUS FOR PRODUCING A MONOCRYSTAL

[75] Inventors: Bernard Ferrand, Voreppe; Yves Grange, Grenoble, both of France

[73] Assignee: Commissariat a l'Energie Atomique, Paris, France

[21] Appl. No.: 614,974

[22] Filed: May 29, 1984

[30] Foreign Application Priority Data

Jun. 6, 1983 [FR] France ............... 83 09338

[51] Int. Cl.⁴ .................. C30B 11/00; C30B 35/00
[52] U.S. Cl. ....................... 422/248; 156/616 A; 156/DIG. 83; 373/157; 422/254; 432/262
[58] Field of Search ............... 422/248, 254; 156/616 R, DIG. 83, 616 A; 373/156, 157; 219/420; 432/262

[56] References Cited

U.S. PATENT DOCUMENTS

| 2,214,976 | 9/1940 | Stockbarger | 422/248 |
| 3,139,653 | 7/1964 | Orem | 422/248 |
| 3,273,969 | 9/1966 | Sirgo | 422/248 |
| 3,514,265 | 5/1970 | Pastore | 422/248 |
| 3,639,718 | 2/1972 | Castonguay et al. | 373/157 |
| 3,796,552 | 3/1974 | Robinson et al. | 422/248 |
| 4,521,272 | 6/1985 | Gault | 156/616 R |

FOREIGN PATENT DOCUMENTS

| 1246889 | 10/1960 | France . |
| 2086418 | 12/1971 | France . |
| 2175594 | 10/1973 | France . |
| 923241 | 4/1963 | United Kingdom . |

Primary Examiner—David L. Lacey
Attorney, Agent, or Firm—Pearne, Gordon, McCoy & Granger

[57] ABSTRACT

According to the invention, an apparatus for producing a monocrystal comprises at least one thermally conductive crucible for receiving the material, a thermally conductive holder having a part able to receive each crucible and extended by a projection, a heater for heating the thermally conductive holder and each crucible containing the material, a drive for the relative displacement of the thermally conductive holder and each crucible containing the material with respect to the said heater and a crystalizer able to bring about the crystallization of one end of the material melted in the heater, once said end has been extracted therefrom, and wherein the projection is positioned so as to check the temperature gradient undergone by the material during the relative displacement.

8 Claims, 8 Drawing Figures

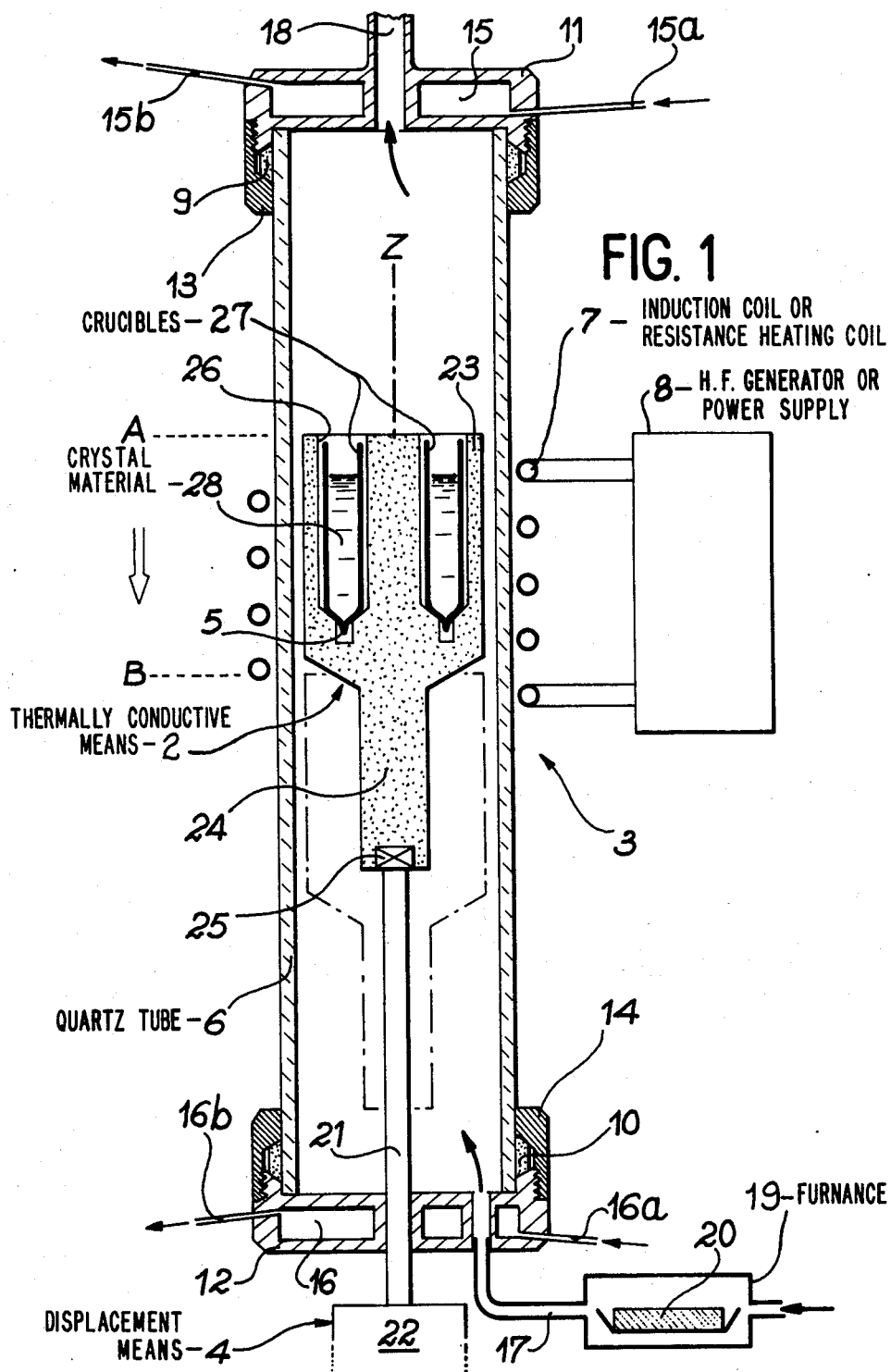

APPARATUS FOR PRODUCING A MONOCRYSTAL

BACKGROUND OF THE INVENTION

The present invention relates to an apparatus for producing a monocrystal. It more particularly applies to producing monocrystals which can be used as scintillators and more specifically to the production of $BaF_2$ barium fluoride monocrystals.

Monocrystal production processes are known, the most frequently used being the BRIDGMAN process. In this case, the material to be crystallized is placed in a crucible, which is displaced in a small temperature gradient from a high temperature zone to a low temperature zone. The smallness of the temperature gradient makes it indispensable to previously purify the material, which is generally carried out by the method known as "zone fusion". According to this method, only part of an ingot of the material to be purified is heated, thus forming a thin fusion layer and said layer is then moved from one end of the ingot to the other, the impurities contained in this ingot then being displaced towards one end thereof. This operation has to be repeated a number of times to obtain a very pure material. Moreover, the use of a very abrupt temperature gradient causes the ingot to break up into several pieces, which are unstable as a result of their small size. The BRIDGMAN process is then applied thereto in order to obtain a monocrystal of an appropriate size.

The procedure associating the zone fusion method and the BRIDGMAN process suffers from disadvantages. The procedure is long and complex and requires several manipulations of the material to be crystallized, which increases the risks of pollution thereof, which must obviously be prevented, particularly in the case of crystals for use in the production of scintillators.

SUMMARY OF THE INVENTION

The object of the present invention is an apparatus for producing a monocrystal, which does not suffer the disadvantages of the previously described procedure, namely in that it is very simple, making it possible to obtain relatively high monocrystal growth rates of 2 to 10 mm/hour for example, requires few manipulations of the material to be crystallized and consequently obviates any risk of pollution thereof. Moreover, it can be completely automated and makes it possible to obtain crystals as required in single form or several crystals at once, which can have all the desired shapes (cylindrical, parallelepipedic, etc.).

More specifically, the present invention relates to an apparatus for producing a monocrystal from a crystallizable material, wherein it comprises at least one thermally conductive crucible for receiving the material, a thermally conductive means having a part able to receive each crucible and extended by a projection, means for heating the thermally conductive means and each crucible containing the material, means for the relative displacement of the thermally conductive means and each crucible containing the material with respect to the said heating means and crystallization means able to bring about the crystallization of one end of the material melted in the heating means, once said end has been extracted therefrom, and wherein the projection is positioned so as to check the temperature gradient undergone by the material during the relative displacement.

The heating means are designed to bring about an abrupt temperature reduction of the material heated by them, when it is extracted therefrom by the displacement means. The thermally conductive material checks the temperature reduction of the material melted by the heating means. The relative displacement means make the material undergo a controlled temperature gradient and ensure that the material is crystalline, the latter then being slowly cooled to ambient temperature.

"Slow cooling" is understood to mean cooling not exceeding a few hundred degrees celsius per hour, e.g. a cooling of approximately 50° to 100° C./h. "Abrupt temperature reduction" is understood to mean a reduction of the type obtained in the zone fusion method known from the prior art.

Obviously, the thermally conductive means can be displaced relative to the heating means or, conversely, the latter can be displaced relative to the thermally conductive means.

In the present invention, the thermally conductive means is fundamental. By heat conduction, it makes it possible to homogenize the temperature of the material and attenuate the abrupt temperature reduction which can also be called the "abrupt temperature gradient". The temperature gradient undergone by the material can be modified at random by modifying the shape and/or the nature of the thermally conductive means.

Thus, according to the invention, the material is melted in the heating means and then, by displacement, emerges at one end thereof. At this end, the material undergoes a temperature reduction and a liquid—solid interface appears in the material. The temperature reduction is sufficiently high to bring about a rejection of all the impurities of the material in its liquid part and consequently to purify the same and is sufficiently attenuated by the thermally conductive means to permit a continuous monocrystalline growth of the material as it emerges from the heating means. This monocrystalline growth is initiated by the end of the material emerging first from the heating means.

Thus, the present invention corresponds to an intermediate procedure between the BRIDGMAN process and the zone fusion method, whilst leading to the results obtained by both these methods, namely the purification of the material and the obtaining of a monocrystal of said material having an appropriate size.

According to a special feature of the invention, the bottom of each crucible is tapered, so as to constitute the crystallization means.

According to another special feature, the apparatus according to the invention comprises a plurality of crucibles, the thermally conductive means having a cavity, whilst the crucibles are arranged symmetrically around said cavity. This obviates local overheating of the thermally conductive means.

According to another preferred feature of the apparatus according to the invention, the thermally conductive means and each crucible are made from purified graphite.

According to another preferred feature, the heating means comprise high frequency field windings. Instead of these, it could also have Joule effect-heated resistive windings, but the resulting heating would then be less homogeneous due to a higher radial gradient.

According to another special feature, the assembly constituted by the thermally conductive means, each crucible and the material is placed in an enclosure insulating it from the outside atmosphere.

Finally, and preferably, the apparatus according to the invention may also comprise means for circulating a chemically inert gas in such a way as to produce the monocrystal in a chemically inert atmosphere.

BRIEF DESCRIPTION OF THE DRAWINGS

The invention is described in greater detail hereinafter relative to non-limitative embodiments and with reference to the attached drawings, wherein show:

FIG. 1 is a diagrammatic view of a special embodiment of the apparatus according to the invention.

DETAILED DESCRIPTION OF THE INVENTION

Figure 2A:
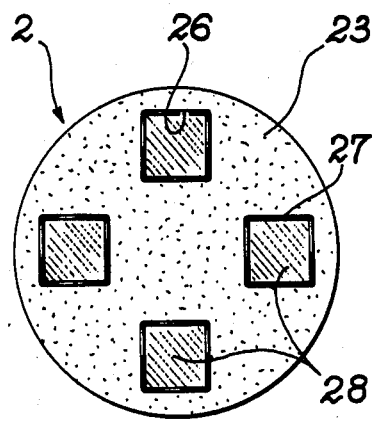
FIGS. 2a to 2d are diagrammatic cross-sectional views of embodiments of the thermally conductive means and the crucibles used in the invention.

FIG. 1 diagrammatically shows a special embodiment of the apparatus according to the invention. It essentially comprises a thermally conductive means 2 able to contain at least one crucible 27 filled with the material 28 to be crystallized, heating means 3, means 4 for the displacement of the thermally conductive means 2 relative to the heating means 3 and crystallization means 5 able to initiate the crystallization of the material, when it is extracted from the heating means 3.

In this case, heating means 3 surrounding a quartz tube 6 of axis Z and which is vertically arranged, comprise high frequency field windings 7, which only surround a portion of tube 6 and which are supplied by a high frequency current generator 8.

The upper or lower end of tube 6 is provided with an O-ring 9 or 10 and is sealed by a threaded plug 11 or 12 on the outside and is in contact with one side of the O-ring, as well as by a ring 13 or 14 threaded on the inside and in contact with the other side of the O-ring, the plug being screwed into the ring so as to compress the joint.

The interior 15 or 16 of each plug 11 or 12 is hollowed out so as to permit the circulation of a cooling fluid introduced by a pipe 15a or 16a into the plug 11 or 12 and discharged by a pipe 15b or 16b from the interior of said plug.

Moreover, a circulation of a chemically inert gas such as argon is established within tube 6. The argon is introduced into the latter by a pipe 17 traversing the lower plug 12 and is discharged from tube 6 by pipe 18 traversing the upper plug 11 and leading to not shown pumping means. Prior to its introduction into tube 6, any trace of water is removed from the argon by making it e.g. circulate in a resistance furnace 19 communicating with pipe 17 for the introduction of the argon into tube 6. The furnace 19 contains fragments 20 of material marketed under the tradename Teflon (polytetrafluoroethylene) which, when heated, decomposes to give carbon tetrafluoride which fixes the water molecules.

The displacement means 4 comprise a rod 21 which traverses the lower plug 12 and is vertically displaceable in tube 6 along axis Z, said rod 21 being controlled by a translation mechanism 22.

The thermally conductive means 2 is designed to be vertically displaceable along axis Z in tube 6 and has an upper part 23, which is on the underside extended by a projection 24, which is provided at its base with a slot 25 in which is fixed rod 21. The upper part 23 of the thermally conductive means 2 has several parallel, vertical recesses 26, which issue at the apex of said upper part 23 and which are designed to receive the crucibles 27 for containing in each case the material 28 to be crystallized. The thermally conductive means 2, which will now be called the crucible support, is displaced in tube 6 from an upper position A in which all the material contained in the different crucibles 27 is within the zone defined by windings 7, which have a length provided for this purpose, to a lower position B in which only the apex of the crucible support 2 is then located within said zone. Preferably the crucibles support 2 and the crucible 27 are made from so-called "nuclear" graphite.

In per se known manner, the bottom of each crucible has a substantially conical tapered shape suitable for the formation of a monocrystalline nucleus of the material contained in the crucible when said material, melted in the heating means, solidifies on leaving the latter. Thus, the bottom of each crucible forms the said crystallization means 5.

The process for producing monocrystals carried out in the apparatus described hereinbefore with regards to FIG. 1 will now be explained. The crucibles 27, filled with the material to be crystallized, are placed in the crucible support 2, which is in the upper position in tube 6. Argon is then circulated in the latter at a rate of approximately 4 liters/minute for example and the resistance furnace 19 is started up. When the latter has reached a temperature of approximately 460° C., (which permits the decomposition of the Teflon (polytetrafluoroethylene) contained in this furnace), the temperature of the assembly constituted by crucible support 2 and the crucibles 27 containing the material to be crystallized is raised in such a way that the assembly is raised to a temperature exceeding, by 20° C., the fusion temperature of the material in question. The assembly is kept in the heating means for an adequate time, e.g. roughly one hour, to have a good temperature homogeneity in the assembly, so that the material is in the molten state.

A downward translation of the crucible support is then brought about, the translation speed being a function of the material to be crystallized, the shape of the crucible support 2 and the number of crucibles used. Thus, a higher speed is used with one crucible than several.

When the crucibles leave the heating zone defined by winding 7, the material at the bottom of the crucibles undergoes a large temperature gradient, which is attenuated by the crucible support 2 and then a monocrystalline nucleus is formed. The lowering of crucible support 2 continues, the formation of a monocrystal in each crucible continues, but the temperature variation undergone by the material leaving the heating zone is sufficient for the impurities contained in the material to diffuse towards the top thereof.

At the end of the translation, corresponding to the bottom position B of the crucible support 2, the monocrystals of the material have been produced and this is followed by slow cooling, with a speed of e.g. approximately 50° to 100° C./hour of the assembly constituted by crucible support 2, crucibles 27 and the material contained in the latter, by acting on the power of high frequency generator 8, until the assembly reaches ambient temperature (approximately 20° C.). High frequency generator 8 and resistance furnace 19 are then stopped and the monocrystals are extracted from crucibles 27. These monocrystals are in the form of ingots, whose upper end containing the impurities initially distributed throughout the material is then cut off.

It should be noted that the automatic operation of the apparatus according to the invention shown in FIG. 1 is total as from the time of starting up the translation of crucible support 2.

The process described hereinbefore is particularly applicable to the production of barium fluoride monocrystals. Under excitation, this material is subject to a light emission which has a slow component and a fast component and, for forming a high quality scintillator material, must be purified so as to reduce the defects of its crystal lattice, in order to increase the intensity of the fast component.

The barium fluoride is then introduced into crucibles 27, e.g. in powder form. In a non-limitative manner, in the case of barium fluoride, the assembly constituted by the crucible support, the crucibles and the barium fluoride contained therein is raised by the heating means 3 to temperatures of approximately 1380° C. and a crucible support translation speed between 1 and 10 mm/hour is used. For example, three crucibles, a speed of approximately 5 mm/hour is suitable.

It should be noted that the mould removal of the barium fluoride monocrystals obtained is easy, in view of the fact that this material undergoes a contraction during its crystallization.

As a result of the present invention, it is possible to simultaneously produce several monocrystals and give very varied shapes thereto. For this purpose it is merely necessary to give the crucibles the required shape. This is shown in FIGS. 2a to 2d, in which it is possible to see crucibles 27 regularly positioned in crucible supports 2 and which have square, rectangular, triangular and elliptical cross-sections. For example, the invention makes it possible to produce monocrystals having a square cross-section with 26 mm sides and 120 mm length, in three crucibles maintained in a cylindrical crucible support of diameter 130 mm.

Figure 2B:
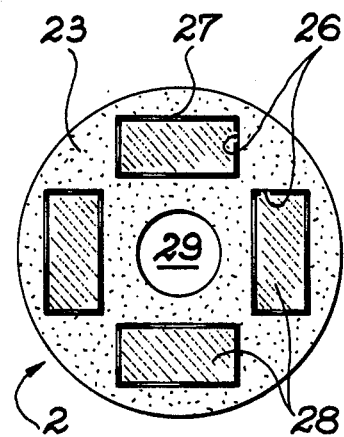
Figure 2C:
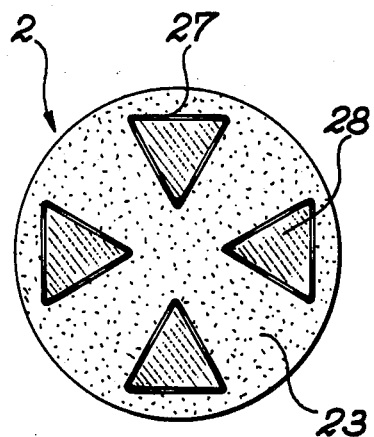
Figure 2D:
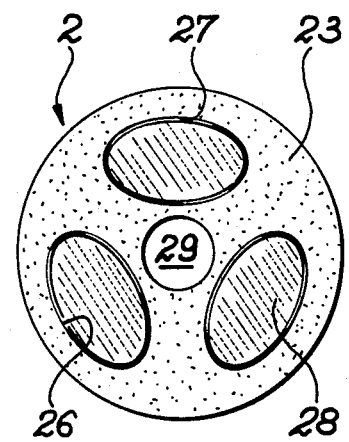

In the case where several crucibles 27 are simultaneously used, the upper part 23 of the crucible support 2 can be centrally provided with a cavity 29, the recesses 26 for receiving the crucibles 27 then being symmetrically distributed around said cavity 29, as is shown in FIGS. 2b and 2d. Cavity 29 makes it possible to obtain a better temperature homogeneity by preventing overheating in the centre of part 23.

The different possible shapes of the monocrystals to be produced can lead to a non-uniform temperature distribution in each cross-section of said monocrystals. This can easily be compensated by a modification of the shape and/or nature of the crucible support 2 and/or the type of high frequency heating (skin effect). By proceeding in this way and as a result of high frequency heating (i.e. by high frequency field windings), the material to be crystallized can be heated uniformly at all points, no matter what its shape. Resistive heating (using Joule effect-heated resistive windings) is possible, but is less homogeneous than high frequency heating for the assembly constituted by the crucible support and the crucibles containing the material to be crystallized.

It has been stated hereinbefore that the initial position of the crucible support 2 is such that the material to be crystallized is initially located in the zone defined by windings 7. Obviously, the initial position of the crucible support could be higher in tube 6, the material to be crystallized then initially being located outside the heating zone defined by windings 7, but the time for producing the crystals would then be longer.

Figure 3C:
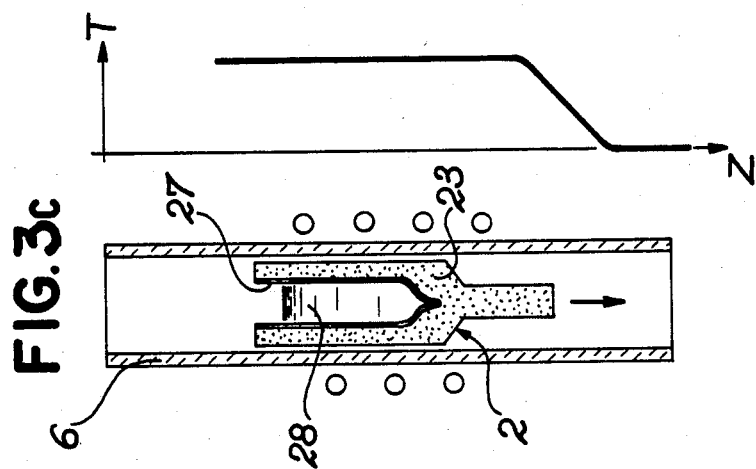
FIGS. 3a to 3c are graphs showing the differences between the invention and the BRIDGMAN and zone fusion methods.
Figure 3B:
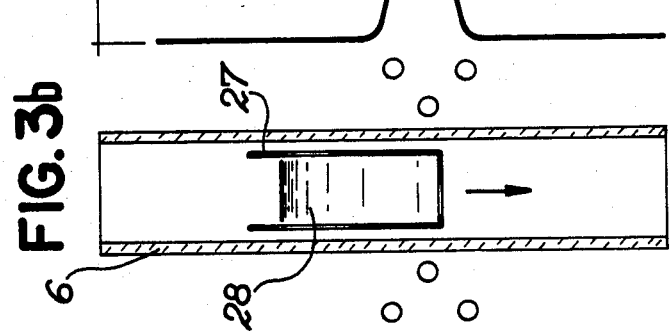
Figure 3A:
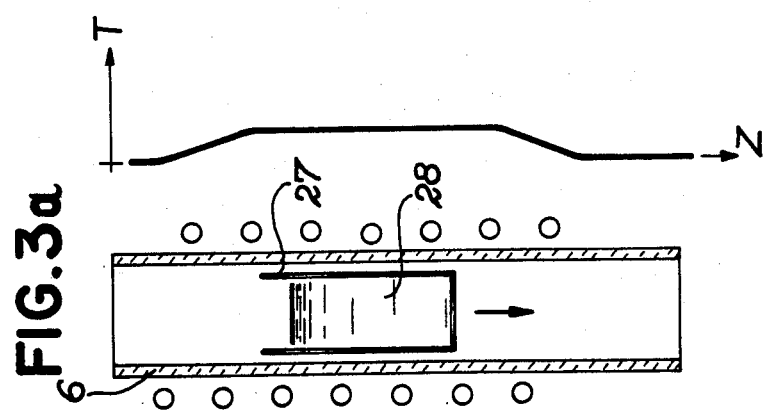

FIGS. 3a, 3b and 3c are graphs giving the temperature T as a function of the position on axis Z for a material to be crystallized, to which is respectively applied the BRIDGMAN process (FIG. 3a), the zone fusion method (FIG. 3b) and a process using the apparatus according to the invention (FIG. 3c).

In the BRIDGMAN process, the temperature gradient undergone by the material to be crystallized is small and there is no question of using a crucible support for attenuating this gradient. In the zone fusion method, the heating of the material is very localized and the temperature gradient undergone by the material is very sudden. In the present invention, use is made of a crucible support for homogenizing the temperature of the material and for attempting the abrupt temperature gradient produced by the heating means and which would only produce a purification effect of the material if it was not attenuated.

In other words, the temperature gradient undergone by the material in the present invention is intermediate between the temperature gradient which it would undergo in the BRIDGMAN process and the temperature gradient which it would undergo in the zone fusion method.

Moreover, on e.g. producing a barium fluoride monocrystal with the apparatus according to the invention, the results obtained are much better than those by firstly using the zone fusion method and then the BRIDGMAN process on the barium fluoride. Thus, a barium fluoride monocrystal produced by means of the invention has a light emission, whose fast component has an intensity which is increased compared with the slow component to a greater extent than the fast component of a barium fluoride monocrystal obtained by successively applying the zone fusion method and the BRIDGMAN process to said barium fluoride.

What is claimed is:

1. An apparatus for producing a monocrystal from a crystallizable material, wherein said apparatus comprises at least one thermally conductive crucible for receiving the material, said at least one crucible including crystallization means, a thermally conductive means having an upper part of a first cross sectional area, said upper part receiving said at least one crucible, and said thermally conducting means having a lower part having a projection extending downwardly, said projection being a second cross sectional area smaller than said first cross sectional area, means for heating the thermally conductive means and said at least one crucible, and means for the relative displacement of the thermally conductive means and said at least one crucible with respect to the said heating means, said crystallization means being able to bring about the crystallization of one end of material melted by the heating means, once the end has been extracted therefrom, and wherein the projection is positioned so as to modify the temperature gradient undergone by the material during the relative displacement.

2. An apparatus according to claim 1, wherein the bottom of said at least one crucible is tapered, so as to form the crystallization means.

3. An apparatus according to claim 1, wherein said at least one crucible comprises plural crucibles, wherein the thermally conductive means has a cavity and wherein the crucibles are arranged symmetrically around the cavity.

4. An apparatus according to claim 1, wherein the thermally conductive means and each crucible are made from purified graphite.

5. An apparatus according to claim 1, wherein the heating means comprise high frequency field windings.

6. An apparatus according to claim 1, wherein the heating means comprise Joule effect-heated resistive windings.

7. An apparatus according to claim 1, including an enclosure containing the thermally conductive means and said at least one crucible to insulate the material from the outside atmosphere.

8. An apparatus according to claim 7 including means for circulating a chemically inert gas through said enclosure, so as to produce the monocrystal in a chemically inert atmosphere.

* * * * *

UNITED STATES PATENT AND TRADEMARK OFFICE
CERTIFICATE OF CORRECTION

PATENT NO.  :   4,666,681

DATED       :   May 19, 1987

INVENTOR(S) :   Bernard Ferrand et al.

It is certified that error appears in the above-identified patent and that said Letters Patent is hereby corrected as shown below:

Column 6, line 18, delete "attempting" and insert --attenuating--;
         line 55, claim 1, delete "the".

Signed and Sealed this

Seventeenth Day of November, 1987

Attest:

DONALD J. QUIGG

Attesting Officer

Commissioner of Patents and Trademarks